United States Patent
Kuniya et al.

(10) Patent No.: US 8,649,217 B2
(45) Date of Patent: Feb. 11, 2014

(54) NON-VOLATILE MEMORY DEVICE AND MANUFACTURING METHOD OF THE SAME

(75) Inventors: Takuji Kuniya, Mie (JP); Katsunori Yahashi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 13/418,516

(22) Filed: Mar. 13, 2012

(65) Prior Publication Data

US 2013/0069029 A1 Mar. 21, 2013

(30) Foreign Application Priority Data

Sep. 16, 2011 (JP) .................................. 2011-203639

(51) Int. Cl.
   *G11C 11/34* (2006.01)
(52) U.S. Cl.
   USPC .................. 365/185.05; 365/185.13; 365/63; 365/69
(58) Field of Classification Search
   USPC .............................. 365/185.05, 185.13, 63, 69
   See application file for complete search history.

(56) References Cited

U.S. PATENT DOCUMENTS

| | | | | |
|---|---|---|---|---|
| 8,502,322 | B2 * | 8/2013 | Nitta | 257/390 |
| 2011/0001112 | A1 * | 1/2011 | Kiyotoshi | 257/3 |
| 2011/0069524 | A1 | 3/2011 | Toba et al. | |
| 2011/0069531 | A1 | 3/2011 | Aburada et al. | |

FOREIGN PATENT DOCUMENTS

| | | |
|---|---|---|
| JP | 6-5803 | 1/1994 |
| JP | 2001-85540 | 3/2001 |
| JP | 2011-66337 | 3/2011 |
| JP | 2011-71236 | 4/2011 |

* cited by examiner

*Primary Examiner* — Fernando Hidalgo
(74) *Attorney, Agent, or Firm* — Oblon, Spivak, McClelland, Maier, Neustadt, L.L.P.

(57) ABSTRACT

According to one embodiment, a memory cell section includes a memory layer in which a non-volatile memory cell is arranged at an intersecting position of a first wiring and a second wiring to be sandwiched by the first wiring and the second wiring. A first drawing section connects the memory cell section and a first contact section with the first wiring, and a second drawing section connects the memory cell section and a second contact section with the second wiring. A dummy pattern is provided in a layer corresponding to the memory layer immediately below the first and second wirings configuring the first and second drawing sections.

20 Claims, 15 Drawing Sheets

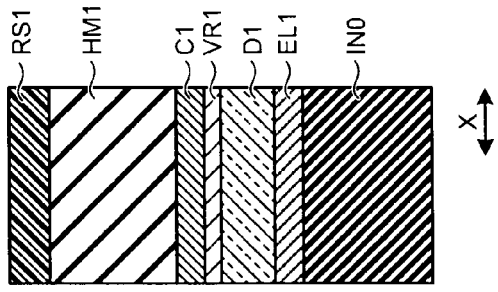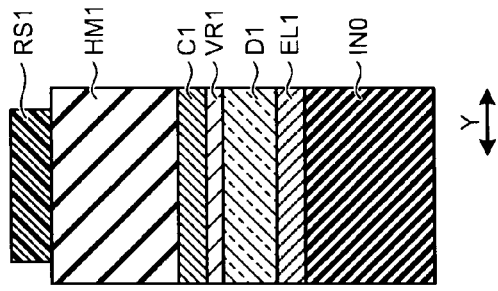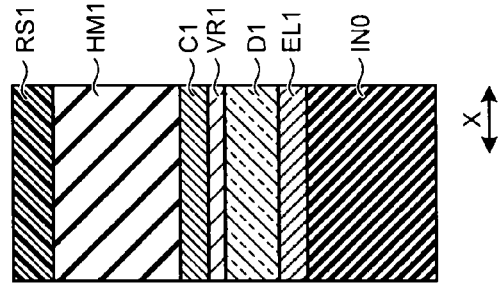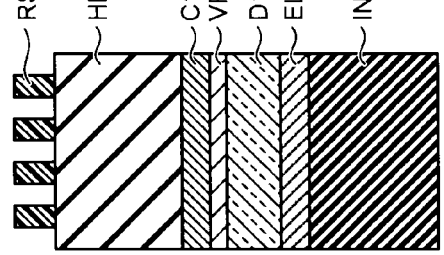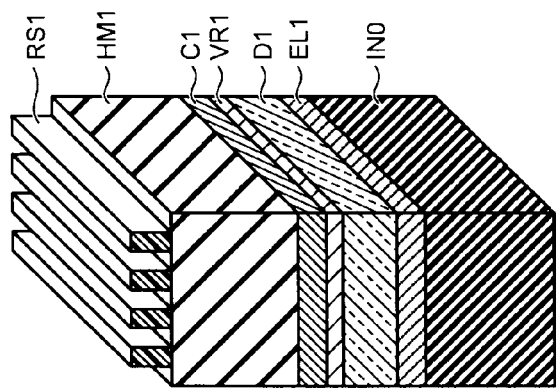

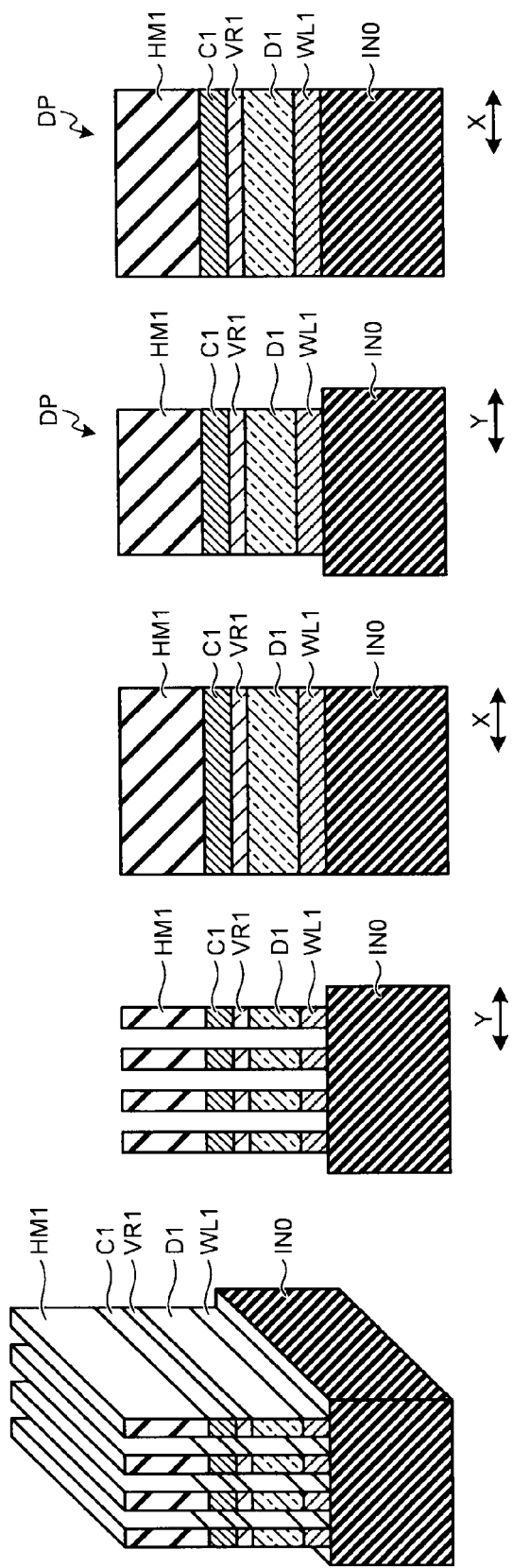

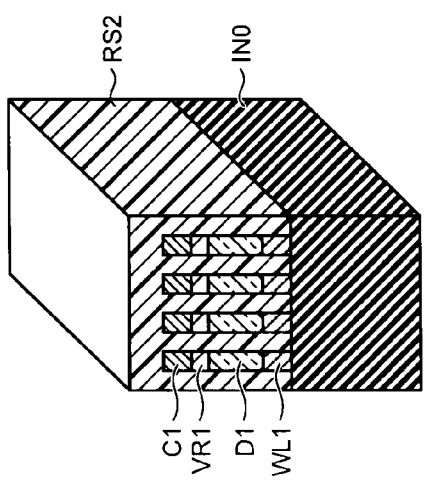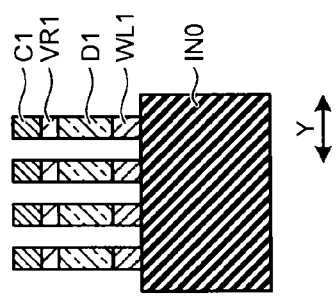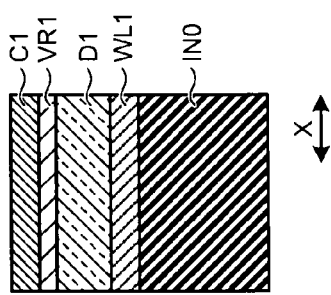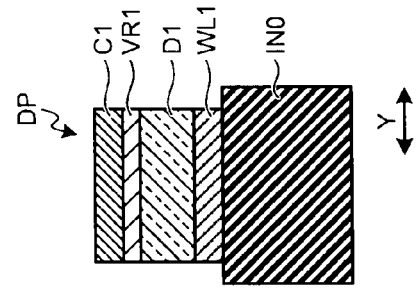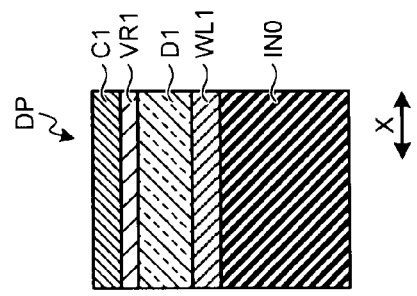

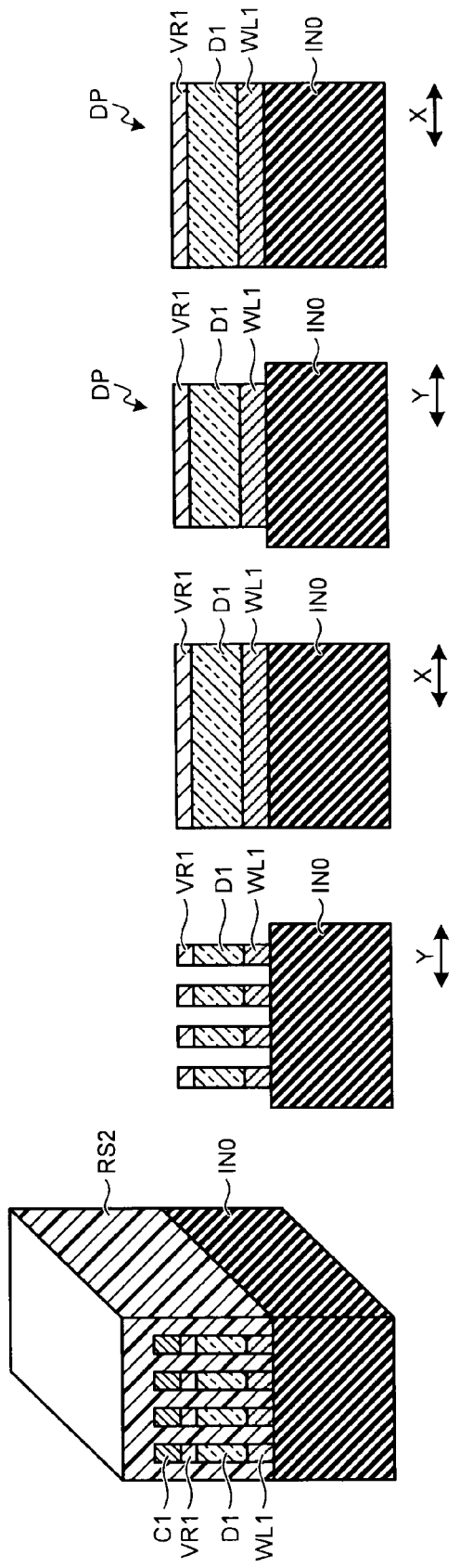

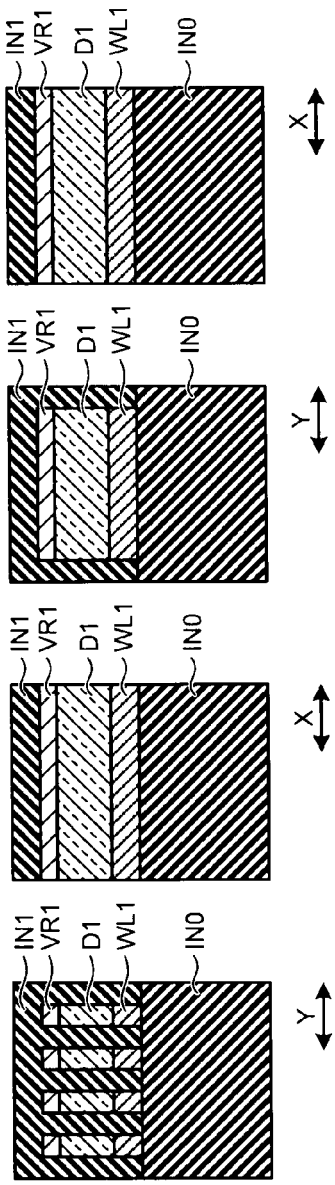
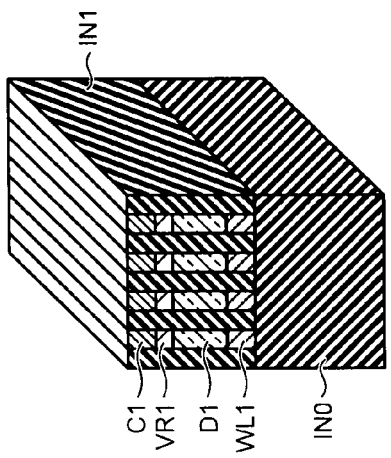

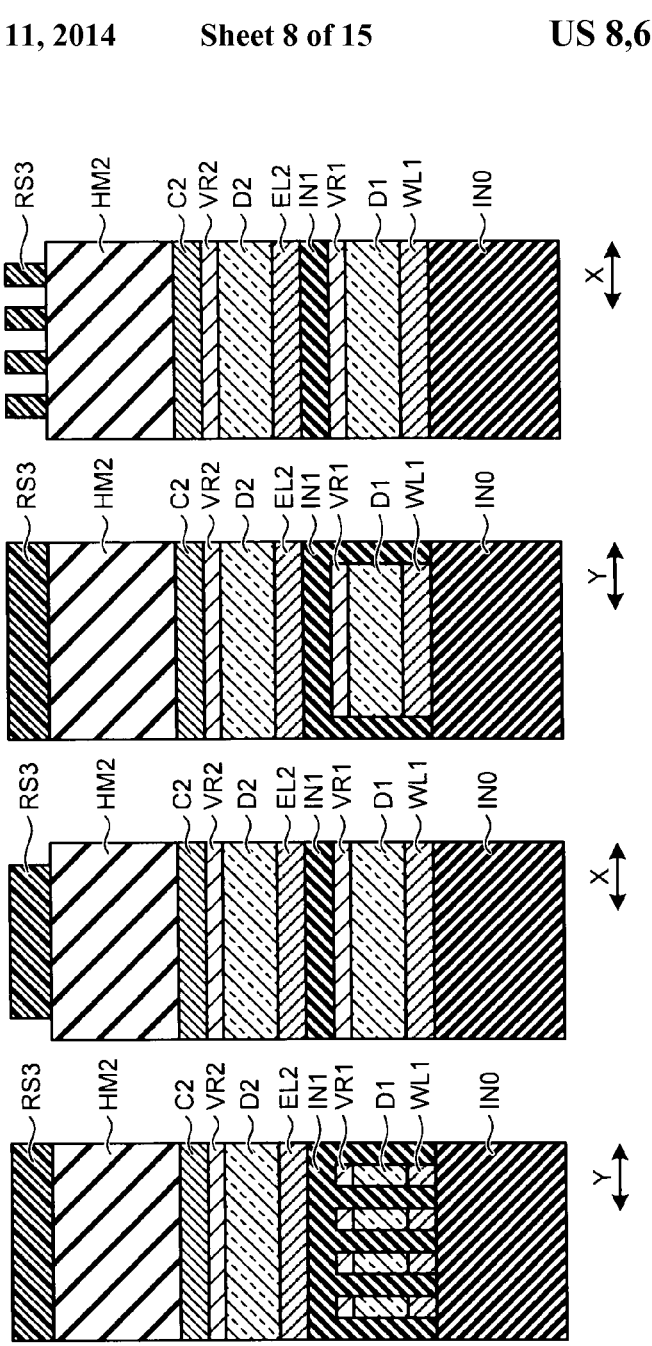

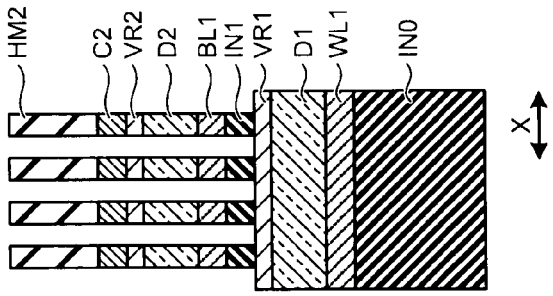
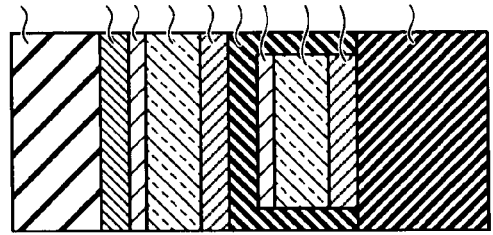
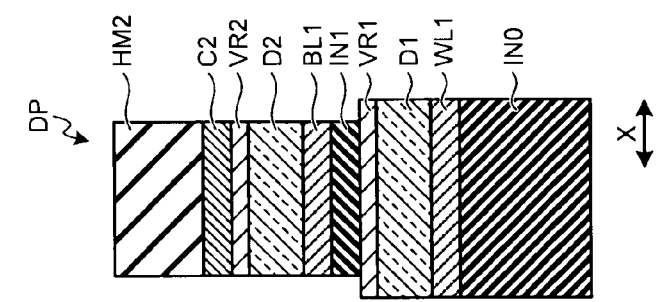
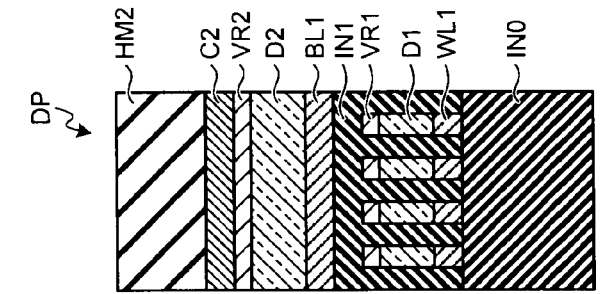
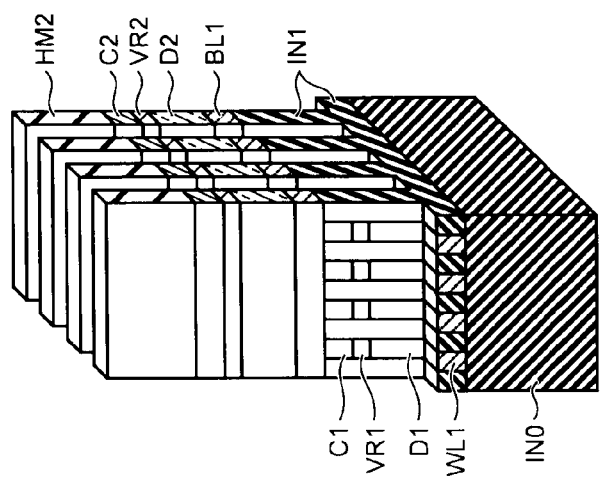

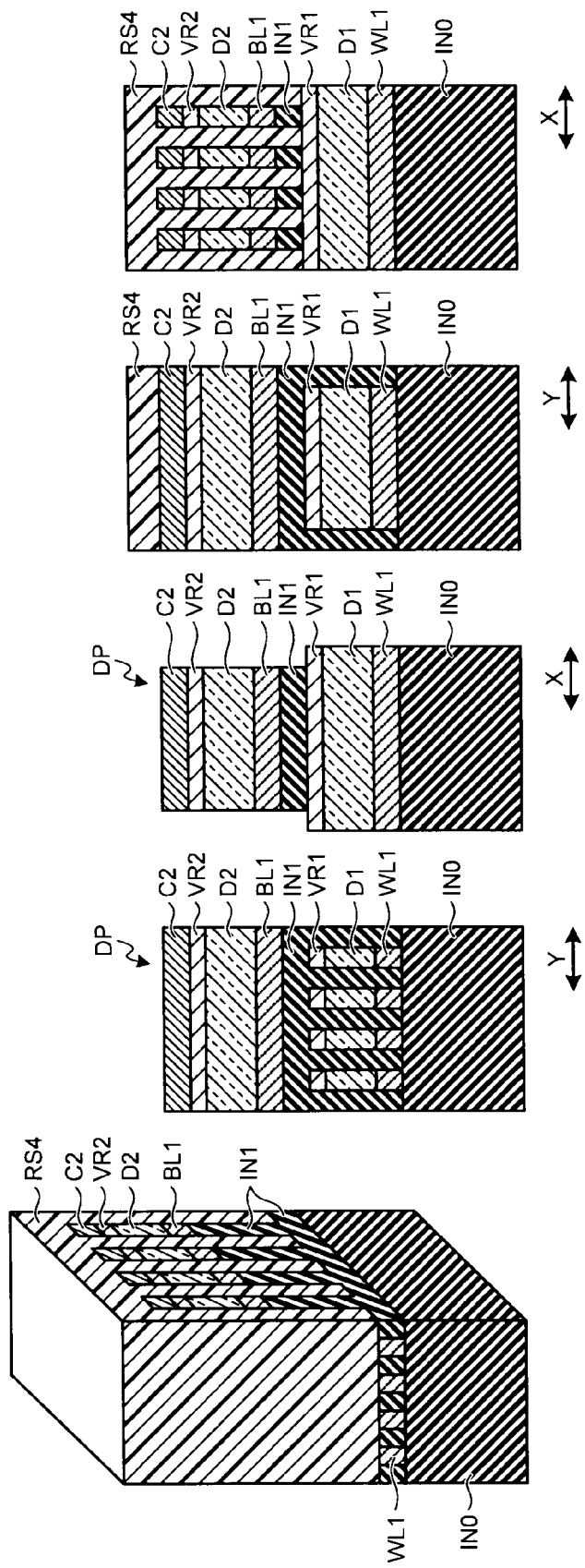

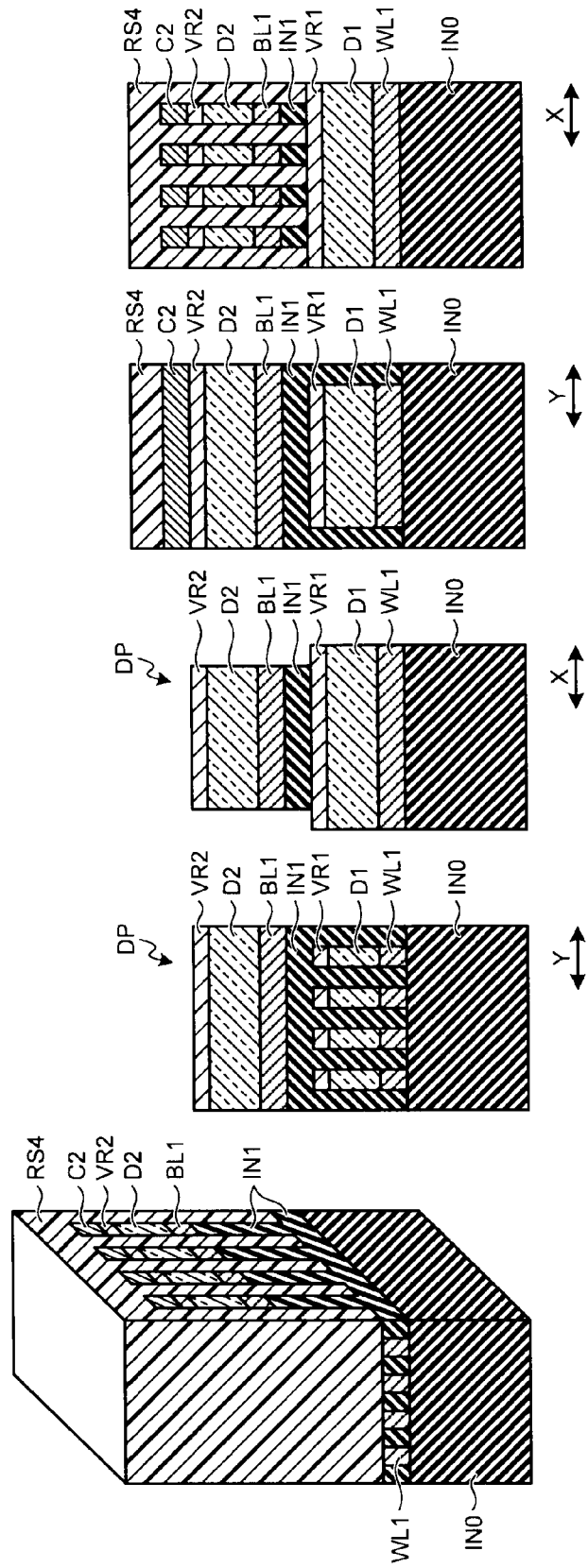

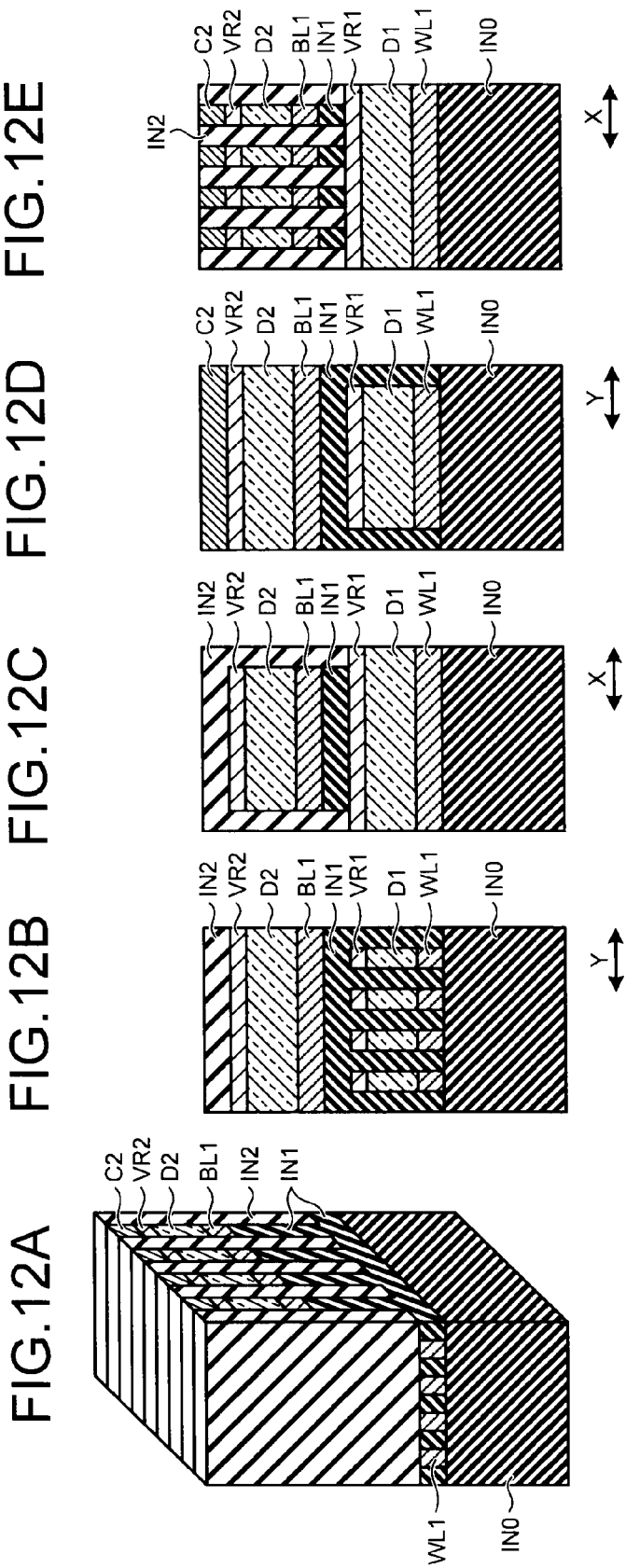

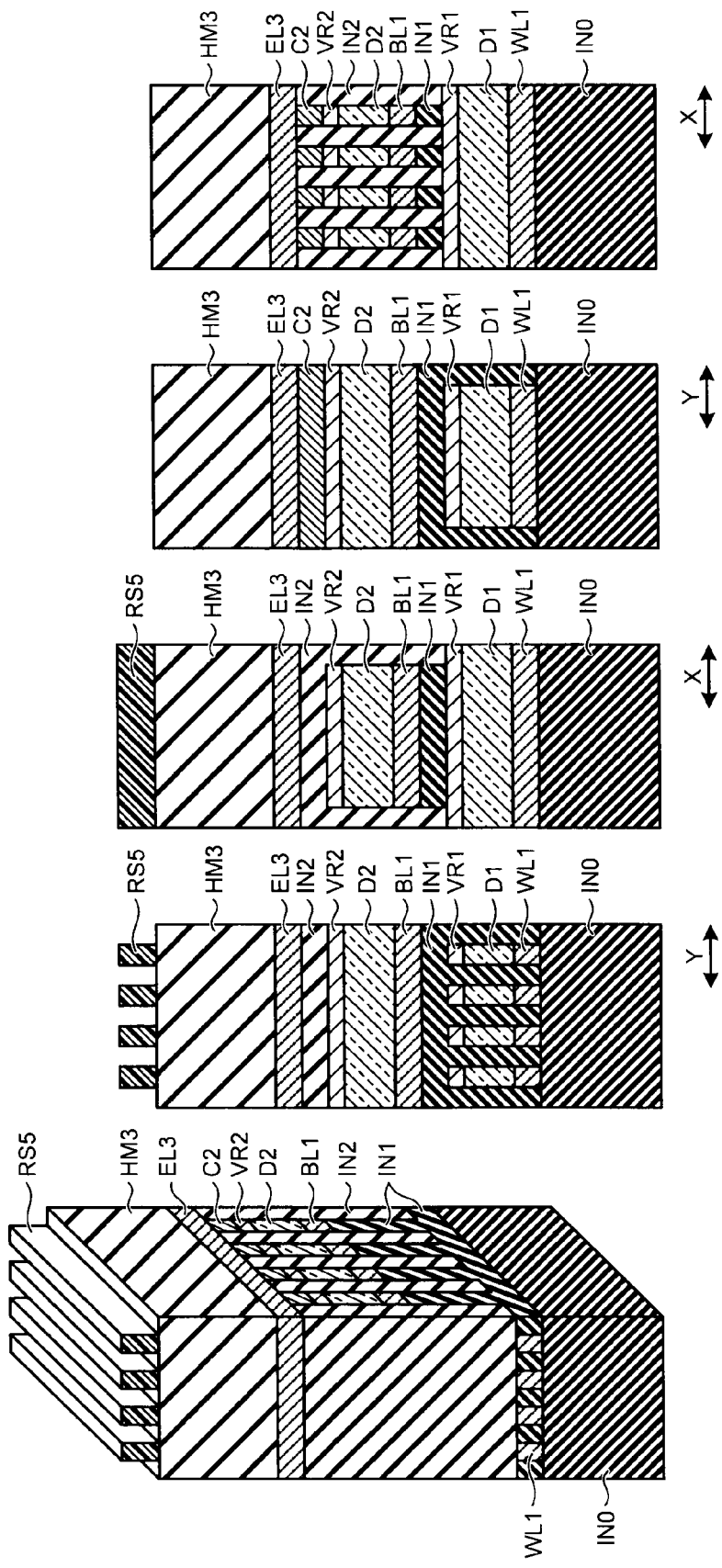

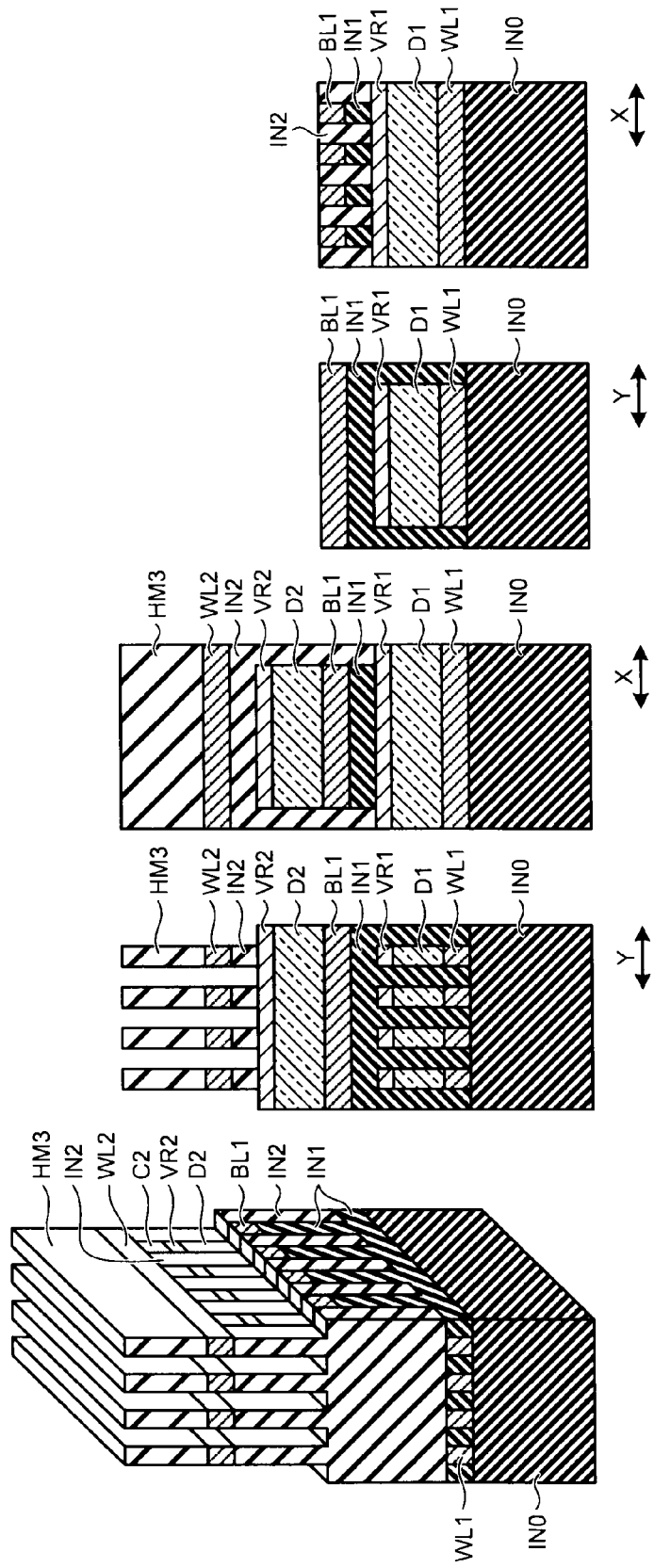

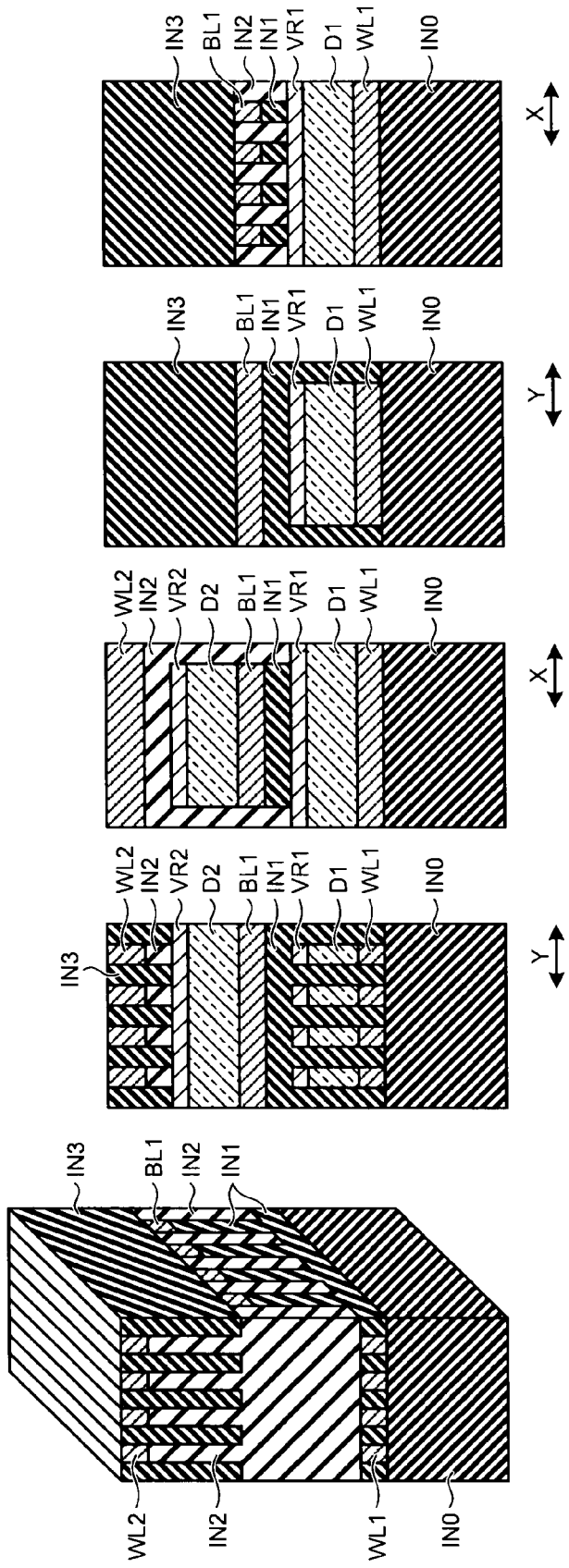

NON-VOLATILE MEMORY DEVICE AND MANUFACTURING METHOD OF THE SAME

CROSS-REFERENCE TO RELATED APPLICATIONS

This application is based upon and claims the benefit of priority from Japanese Patent Application No. 2011-203639, filed on Sep. 16, 2011; the entire contents of which are incorporated herein by reference.

FIELD

Embodiments described herein relate generally to a non-volatile memory device and a manufacturing method of the same.

BACKGROUND

In recent years, ReRAM (Resistive Random Access Memory) that stores, in a non-volatile manner, resistance value information, for example, a high resistance state and a low resistance state, of an electrically rewritable variable resistive element is given attention for the non-volatile memory device. With respect to such ReRAM, a structure where a memory cell array, in which a variable resistance memory cell having a variable resistive element serving as a memory element and a rectifier element such as a diode connected in series is arrayed to an array shape at an intersection of a plurality of word lines extending parallel to a first direction and a plurality of bit lines extending parallel to a second direction perpendicular to the first direction, is stacked in plurals, and the word line or the bit line is shared between the memory cell arrays adjacent in a stacking direction is known.

Such non-volatile memory device may be manufactured in the following manner. A first wiring material layer, which becomes the word line, and a first memory layer including a variable resistive layer, which becomes the variable resistive element, and a diode layer, which becomes a rectifier element, are stacked on an inter-layer insulating film. The first wiring material layer and the first memory layer are then etched to a line-and-space pattern extending in the first direction through a lithography technique and a reactive ion etching technique (hereinafter referred to as RIE method), and the inter-layer insulating film is filled between the patterns. The first wiring material layer thus becomes the word line. Thereafter, a second wiring material layer, which becomes the bit line, and a second memory layer including the variable resistive layer and the diode layer are stacked on the inter-layer insulating film, and the second memory layer, the second wiring material layer, the first memory layer, and the inter-layer insulating film are etched to a line-and-space pattern extending in the second direction by the lithography technique and the RIE method, and the inter-layer insulating film is filled between the patterns. The second wiring material layer thus becomes the bit line, and a first layer of memory cell array in which a memory cell having a column structure is arranged in a matrix shape at a cross-point of the word line and the bit line is formed. Thereafter, similar processes are repeated to form plural layers of memory cell arrays.

In a memory cell section in which the word line and the bit line intersect, a memory cell configuring member that configures the memory cell exists in a lower layer portion of the wiring material layer to become the word line or the bit line, but the memory cell configuring member does not exist and an inter-layer insulating film made of $SiO_2$ normally exists at the lower layer portion of the wiring material layer in a drawing section of only the word line or only the bit line connecting between the memory cell section and a contact section.

In the conventional art, the inter-layer insulating film is sufficiently etched to suppress the short-circuit between the adjacent memory cells in the memory cell section when collectively processing the memory cell configuring members for two layers. As a result, the aspect ratio becomes large since the inter-layer insulating film at the lower layer becomes too etched in the drawing section, the stress difference between the memory cell configuring member such as the wiring material layer and the inter-layer insulating film becomes emphasized, and the pattern may become twisted.

BRIEF DESCRIPTION OF THE DRAWINGS

FIGS. 3A to 15E are diagrams showing one example of a procedure of a manufacturing method of the non-volatile memory device according to the embodiment.

DETAILED DESCRIPTION

In general, according to one embodiment, a non-volatile memory device includes a memory cell section, a first contact section, a second contact section, a first drawing section, and a second drawing section. The memory cell section includes a first wiring extending in a first direction, a second wiring extending in a second direction intersecting the first wiring, and a memory layer in which a non-volatile memory cell is arranged at an intersecting position of the first and second wirings so as to be sandwiched by the first and second wirings, where the memory layer is stacked in plurals while sharing the first or second wiring with the memory layer adjacent to a thickness direction. The first contact section is arranged in the extending direction of the first wiring of the memory cell section, and the second contact section is arranged in the extending direction of the second wiring of the memory cell section. The first drawing section connects between the memory cell section and the first contact section with the first wiring, and the second drawing section connects between the memory cell section and the second contact section with the second wiring. A dummy pattern is provided in a layer corresponding to the memory layer immediately below the first and second wirings configuring the first and second drawing sections.

The non-volatile memory device and the manufacturing method of the same according to the embodiment will be described in detail below with reference to the accompanied drawings. It should be recognized that the present invention is not limited by such embodiment. Furthermore, the cross-sectional view of the non-volatile memory device used in the following embodiments is merely schematic, and the relationship of the thickness and the width of the layer, the ratio of the thickness of each layer, and the like may differ from the actual relationship, ratio, etc. Resistance change memory will be described by way of example for the non-volatile memory device.

Figure 1:
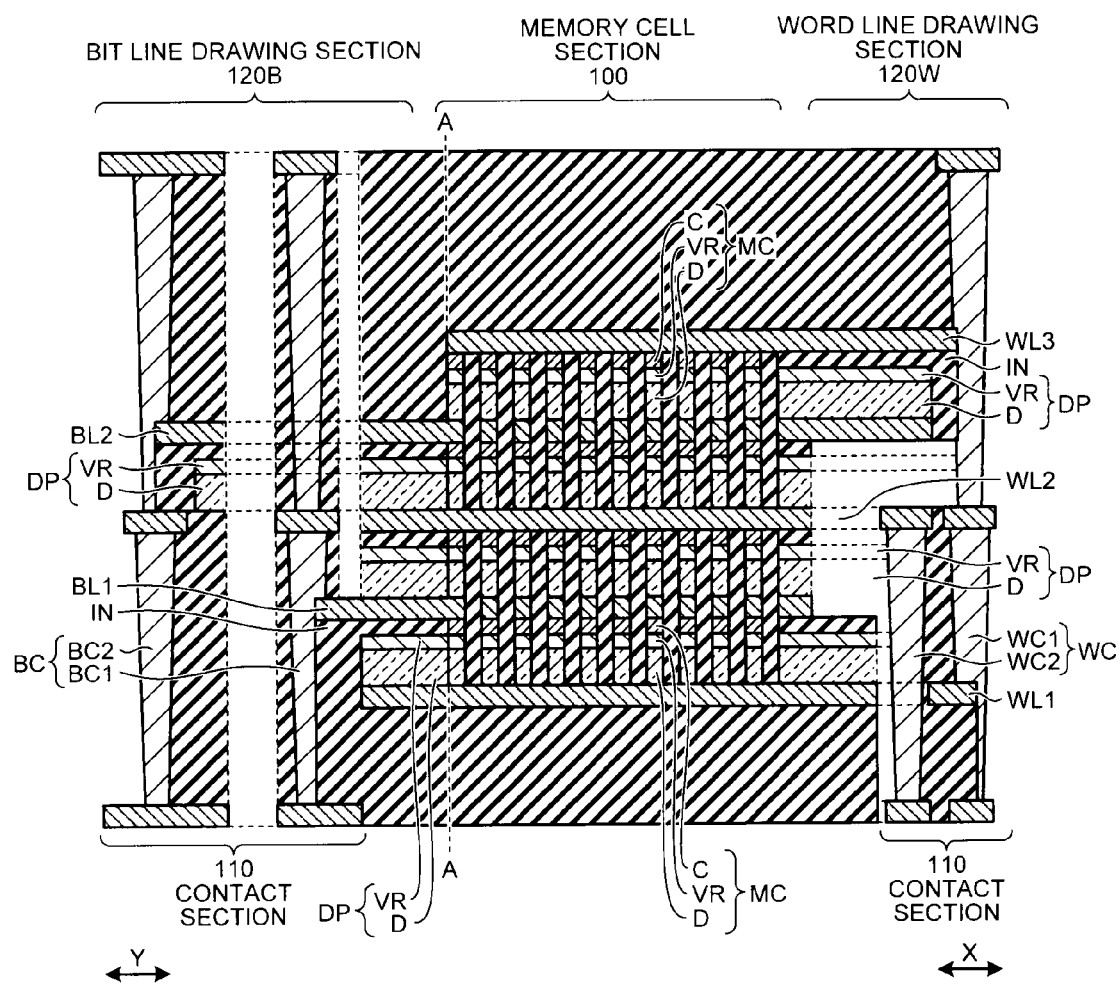
FIG. 1 is a schematic diagram showing a configuration of a resistance change memory serving as a non-volatile memory device according to an embodiment.
Figure 2A:
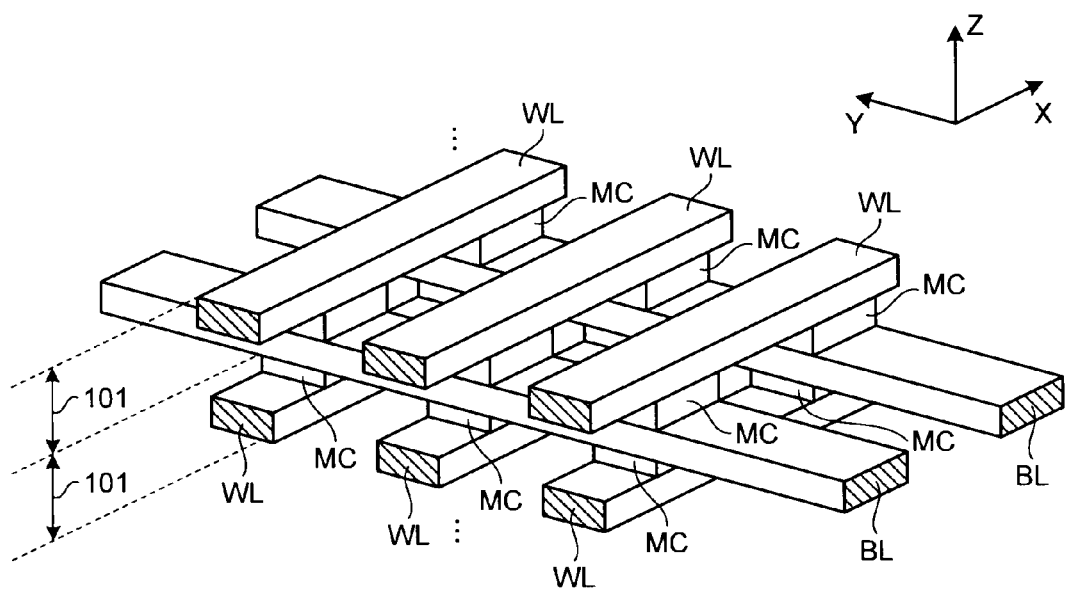
FIGS. 2A and 2B are diagrams schematically showing a structure of the resistance change memory according to the embodiment.
Figure 2B:
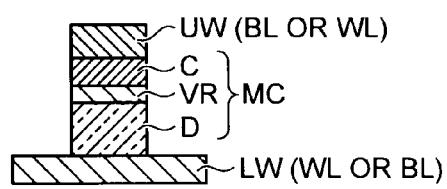

FIG. 1 is a schematic diagram showing a configuration of resistance change memory serving as the non-volatile memory device according to the embodiment, and FIGS. 2A and 2B are diagrams schematically showing a structure of the resistance change memory according to the embodiment, where FIG. 2A is a perspective view showing a configuration of a memory cell array and FIG. 2B is a cross-sectional view showing one example of a structure of the variable resistance memory cell. In FIG. 1, the region on the right side of the line A-A is the cross-section in a direction parallel to the extending direction (X direction) of a word line WL (WL1 to WL3), and the region on the left side of the line A-A is the cross-section in a direction parallel to the extending direction (Y direction) of a bit line BL (BL1, BL2).

As shown in FIG. 1, the non-volatile memory device includes a memory cell section (memory cell forming region) 100 in which the variable resistance memory cell (hereinafter also simply referred to as memory cell) MC serving as the non-volatile memory cell is arranged, a contact section 110 connected to a peripheral circuit (not shown), and drawing sections (drawing regions) 120W, 120B for connecting between the memory cell section 100 and the contact section 110 on a substrate (not shown) formed with the peripheral circuit.

As shown in FIG. 2A, the memory cell section 100 includes a memory cell array 101 in which a plurality of word lines WL extending in the X direction and a plurality of bit lines BL extending in the Y direction perpendicular to the X direction at a height different from the word line WL are arranged intersecting each other, and the memory cell MC is arranged at each intersecting position. The memory cell section 100 also has a plurality of memory cell arrays 101 stacked in a Z direction (height direction), so that the bit line BL or the word line WL is shared between the memory cells MC adjacent in the Z direction.

The variable resistance memory cell MC has a structure in which a variable resistive layer and a rectifying layer are connected in series. In an example shown in FIG. 1 and FIG. 2B, a structure in which a rectifying layer D, a variable resistive layer VR, and a cap film C are stacked in order on a lower layer wiring LW (word line WL or bit line BL) is adopted. An upper layer wiring UW (bit line BL or word line WL) extending in a direction orthogonal to the lower layer wiring LW is arranged on the cap film C.

The rectifying layer D is made of a material having a rectifying effect such as a schottky diode, PN junction diode, or a PIN diode. For instance, the rectifying layer D here is assumed to be set to flow a current in a direction from the bit line BL towards the word line WL.

The variable resistive layer VR is configured by a variable resistive element including a metal oxide, a carbon film or the like in which a high resistance state and a low resistance state can be switched by controlling a voltage value and an application time, a phase change memory element for changing the resistance value by a state change of crystallization/amorphousness of a chalcogenide compound, and the like. A metal oxide film including at least one or more elements of Si, Ti, Ta, Nb, Hf, Zr, W, Al, Ni, Co, Mn, Fe, Cu, Mo can be used as the variable resistive element. A barrier metal film made of TiN, TaN, WN, or the like may be arranged above and below the variable resistive layer VR.

The cap film C is a film made of a conductive material introduced as a stopper film in the process to connect between the memory cell MC and the upper layer wiring UW (the word line WL or the bit line BL). A W film is used for the cap film C herein.

The contact section 110 is arranged at the periphery of the memory cell section 100, and a contact plug is arranged to pass through an inter-layer insulating film IN formed at the periphery of the memory cell array 101. The lower end of each contact plug of the contact section 110 is connected to an element configuring the peripheral circuit controlling the memory cell MC.

The contact section 110 includes a word line contact WC connected to the word line WL, and a bit line contact BC connected to the bit line BL. The word line contact WC is arranged in the extending direction of the word line WL, and the bit line contact BC is arranged in the extending direction of the bit line BL. The word line contact WC is shared by the word line WL of every other layer, and as a result, two word line contacts WC1, WC2 merely need to be provided in the region of the contact section 110 cut along a cross-section parallel to the extending direction of the word line WL. The bit line contact BC is arranged for every bit line BL. In this example, a case in which two bit line contacts BC1, BC2 are arranged is shown.

The drawing sections 120W, 120B are wiring forming regions of pulling the word line WL and the bit line BL connected to the memory cell MC of the memory cell section 100 to the word line contact WC and the bit line contact BC, respectively. The word line WL is connected to the word line contact WC through the word line drawing section 120W, and the bit line BL is connected to the bit line contact BC through the bit line drawing section 120B.

In this embodiment, a layer corresponding to the memory layer immediately below the wiring (word line WL or bit line BL) of the drawing section 120W, 120B includes a dummy pattern DP made of a material different from the inter-layer insulating film IN. A pattern including a stacked structure same as the memory cell MC up to the middle may be used for the dummy pattern DP. In this case, the configuring member of the memory cell MC is removed by a predetermined amount from the upper part, and the inter-layer insulating film IN is arranged in the removed portion so that the dummy pattern DP does not function as the actual memory cell MC.

The dummy pattern DP functions as a stopper during the etching to form the memory cell MC by arranging the dummy pattern DP at the lower part of the wiring of the drawing section 120W, 120B in such manner, so that the etching amount during the etching at the drawing section 120W, 120B can be reduced and the destruction of the wiring pattern at the drawing section 120W, 120B can be prevented.

The manufacturing method of such non-volatile memory device will now be described. FIGS. 3A to 15E are diagrams showing one example of a procedure of a manufacturing method of the non-volatile memory device according to the embodiment, where FIGS. 3A to 15A are perspective views of the memory cell section (memory cell forming region), FIGS. 3B to 15B are cross-sectional views perpendicular to the X direction of the word line drawing section (word line drawing region), FIGS. 3C to 15C are cross-sectional views perpendicular to the Y direction of the word line drawing section (word line drawing region), FIGS. 3D to 15D are cross-sectional views perpendicular to the X direction of the bit line drawing section (bit line drawing region), and FIGS. 3E to 15E are cross-sectional views perpendicular to the Y direction of the bit line drawing section (bit line drawing region).

First, a peripheral circuit (not shown) including an element such as a cell controlling transistor to be connected to the word line WL and the bit line BL of the memory cell MC, and a wiring layer connected to the element is formed on a semiconductor substrate (not shown), and then an inter-layer insulating film IN0 is formed on the peripheral circuit. As shown in FIGS. 3A to 3E, a memory cell configuring member configuring the memory cell array of the first layer is formed over the entire surface of the inter-layer insulating film IN0. In other words, an electrode layer EL1, a rectifying layer D1, a variable resistive layer VR1, and a cap film C1 are stacked in order. For example, W may be used for the electrode layer EL1 and the cap film C1, NiO may be used for the variable resistive layer VR1, and a polysilicon film having a PIN structure in which a P-type polysilicon, an I-type polysilicon, and an N-type polysilicon are stacked may be used for the rectifying layer D1. This is the same for the formation of the memory cell array below.

The hard mask layer HM1 made of TEOS (Tetraethoxysilane), SiN, or the like is then formed on the cap film C1. The hard mask layer HM1 is set to a thickness such that the layers from the previously formed electrode layer EL1 to the cap film C1 can be etched with the dry etching method and the like. Furthermore, a resist RS1 is applied on the hard mask layer HM1, and then patterning is carried to the line-and-space pattern shape extending in the X direction with the memory cell section 100 and the word line drawing section 120W by the lithography technique. In the bit line drawing section 120B, the resist RS1 is patterned so that the stacked films from the electrode layer EL1 to the cap film C1 remain.

Thereafter, the hard mask layer HM1 is processed by an anisotropic etching such as the RIE method using the resist RS1 as the mask to transfer the pattern to the hard mask layer HM1. Furthermore, the resist RS1 is removed by oxygen discharge, and then, the etching is carried out until the bottom portion of the electrode layer EL1 is cut from the electrode layer EL1 adjacent in the Y direction by the anisotropic etching such as the RIE method using the hard mask layer HM1 as the mask, as shown in FIGS. 4A to 4E. The electrode layer EL1 thereby becomes the word line WL1, and the rectifying layer D1, the variable resistive layer VR1, and the cap film C1 are formed as a pattern extending in the X direction same as the word line WL1. A dummy pattern DP with the stacked films from the electrode layer EL1 to the cap film C1 remained is thus formed in the bit line drawing section 120B.

Then, the hard mask layer HM1 is removed, and a resist RS2 is applied over the entire surface of the substrate and the patterning is carried out such that the resist RS2 remains in the memory cell section 100, as shown in FIGS. 5A to 5E. That is, the resist RS2 is formed here to cover the memory cell section 100, and the resist RS2 is not formed in the word line drawing section 120W and the bit line drawing section 120B at the periphery of the memory cell section 100.

Subsequently, as shown in FIGS. 6A to 6E, the upper part of the dummy pattern DP is removed by a predetermined amount through the dry etching or the wet etching with the resist RS2 as the mask. The removed amount is such that the dummy pattern DP is not electrically connected to the wiring (bit line BL in this case) formed on the upper layer. An example of removing the cap film C1 is illustrated. The pattern of the word line drawing section 120W and the bit line drawing section 120B is thus retrieved by the thickness of the cap film C1 compared to the upper surface of other regions (memory cell section 100). In this example, the etching is carried out such that the cap film C1 is removed, but the etching may be stopped at any portion of the stacked films including the rectifying layer D1, the variable resistive layer VR1, and the cap film C1. However, it is desirable to stop the etching at a height where at least one part of the variable resistive layer VR1 remains from the standpoint of suppressing the etching amount in the bit line drawing section 120B small when carrying out the patterning of the stacked films to form the memory cell array of the first layer.

After the resist RS2 is removed, as shown in FIGS. 7A to 7E, the inter-layer insulating film IN1 such as the TEOS film (silicon dioxide film) is embedded in the etched region, and the upper surface is planarized while removing the inter-layer insulating film IN1 formed above the cap film C1 with the cap film C1 of the memory cell section 100 as the stopper by the CMP method.

Thereafter, as shown in FIGS. 8A to 8E, the memory cell configuring member configuring the memory cell array of the second layer is formed. In other words, an electrode layer EL2, a rectifying layer D2, a variable resistive layer VR2, and a cap film C2 are stacked in order. Here, the rectifying layer D2 is formed such that the stacking order of the P-type polysilicon layer, the I-type polysilicon layer, and the N-type polysilicon layer of the rectifying layer D2 is the opposite of the rectifying layer D1 of the first layer. This is to flow the current from the bit line BL towards the word line WL.

A hard mask layer HM2 having a thickness such that the cap film C2 to the rectifying layer D1 of the first layer of the memory cell array can be removed by etching is formed on the cap film C2. Thereafter, a resist RS3 is applied on the hard mask layer HM2, and a pattern in which the line-and-space pattern of the lower layer is rotated 90 degrees in the in-plane direction, that is, the line-and-space pattern extending in the Y direction is formed in the memory cell section 100 and the bit line drawing section 120B by the lithography technique. In the word line drawing section 120W, the resist RS3 is patterned such that the stacked films from the electrode layer EL2 to the cap film C2 remain.

As shown in FIGS. 9A to 9E, the hard mask layer HM2 is processed to transfer the pattern to the hard mask layer HM2 by the anisotropic etching such as the RIE method using the resist RS3 as the mask. The resist RS3 is removed by the oxygen discharge, and thereafter, the cap film C2 to the rectifying layer D1 are etched until the bottom portion of the rectifying layer D1 is separated from the rectifying layer D1 of the memory cell MC adjacent in the X direction in the forming region of the memory cell section 100 by the anisotropic etching such as the RIE method using the hard mask layer HM2 as the mask. In this case, the memory cell configuring member is first etched under a condition that there is a selection ratio with respect to the inter-layer insulating film (oxide film) IN1 (condition that memory cell configuring member is more easily etched than inter-layer insulating film IN1), and then the inter-layer insulating film IN1 is etched under a condition that there is barely no selection ratio between the memory cell configuring member (rectifying layer D1 above all) and the inter-layer insulating film IN1 (condition that etching rate of inter-layer insulating film IN1 and remaining memory cell configuring member is substantially the same), so that the height of the inter-layer insulating film IN1 is sufficiently lowered in the memory cell section 100 such that the etching residual of the memory cell configuring member does not produce between the memory cells MC adjacent in the X direction.

Thus, in the memory cell section 100, the electrode layer EL2 of the second layer becomes the bit line BL1, and the memory cell array of the first layer in which the memory cell MC including stacked films of the cap film C1, the variable resistive layer VR1, and the rectifying layer D1 defined by the width of the word line WL1 and the width of the bit line BL1 is arranged at each intersecting position of the word line WL1 and the bit line BL1 is formed. The variable resistive layer VR2, the rectifying layer D2, and the cap film C2 of the second layer are formed as a pattern extending in the Y direction same as the bit line BL1 (electrode layer EL2 of second layer). In the etching of the inter-layer insulating film IN1, the etching is sufficiently carried out so that there are no remains (residuals) of the memory cell configuring member, in particular, the rectifying layer D1 immediately above the word line WL1 between the adjacent memory cells MC in the memory cell section 100.

In the bit line drawing section 120B, the inter-layer insulating film IN1 and the memory cell configuring members of the second layer are stacked on the dummy pattern DP, where the etching is not carried out up to the dummy pattern DP below the inter-layer insulating film IN1 since the inter-layer insulating film IN1 functions as a stopper when etching the memory cell configuring member in the first condition. The inter-layer insulating film IN1 is etched in the etching of the inter-layer insulating film IN1 under the next condition that there is barely any selection ratio between the memory cell configuring member and the inter-layer insulating film IN1. In this case, the variable resistive layer VR1 at the upper part of the dummy pattern DP is etched in some measure under the condition of the etching in which the rectifying layer D1 immediately above the word line WL1 where the residual easily produces between the adjacent memory cells MC can be sufficiently removed, but the etching can be stopped at the upper part of the dummy pattern DP. Therefore, etching is carried out only from the cap film C2 of the second layer to the upper part of the dummy pattern DP, and the etching amount in the bit line drawing section 120B is suppressed compared to the conventional art technique of etching to the depth corresponding to the rectifying layer D1. As a result, the stress difference between the inter-layer insulating film IN1 and the material configuring the bit line BL1 can be suppressed, and deformation or destruction of the pattern of the bit line drawing section 120B can be suppressed. In the meanwhile, the dummy pattern DP with the stacked films from the electrode layer EL2 to the cap film C2 remained is thus formed in the word line drawing section 120W.

Then, the hard mask layer HM2 is removed, and a resist RS4 is applied over the entire surface of the substrate and the patterning is carried out such that the resist RS4 remains other than in the forming region of the dummy pattern DP, as shown in FIGS. 10A to 10E. That is, the resist RS4 is formed here to cover the memory cell section 100 and the bit line drawing section 120B excluding the word line drawing section 120W. However, when further increasing the layers of the memory cell array while forming the dummy pattern on the upper layer of the drawing sections 120W, 120B, the resist RS4 is not formed in the drawing sections 120W, 120B and the resist RS4 is formed to cover the memory cell section 100, similar to the resist RS2 shown in FIGS. 5A to 5E.

Subsequently, as shown in FIGS. 11A to 11E, the upper part of the dummy pattern DP is removed by a predetermined amount through the dry etching or the wet etching with the resist RS4 as the mask. The removed amount is such that the dummy pattern DP is not electrically connected to the wiring (word line WL in this case) formed on the upper layer. An example of removing the cap film C2 is illustrated here, but the etching may be stopped at any portion of the stacked films including the rectifying layer D2, the variable resistive layer VR2, and the cap film C2, similar to the case of the cap film C1. However, it is desirable to stop the etching at a height where at least one part of the variable resistive layer VR2 remains from the standpoint of suppressing the etching amount in the word line drawing section 120W small when carrying out the patterning of the stacked films to form the memory cell array of the second layer.

After the resist RS4 is removed, as shown in FIGS. 12A to 12E, the inter-layer insulating film IN2 such as the TEOS film is embedded in the etched region, and the upper surface is planarized while removing the inter-layer insulating film IN2 formed above the cap film C2 with the cap film C2 of the memory cell section 100 as the stopper by the CMP method.

Thereafter, the processes shown in FIGS. 8A to 12E are repeatedly carried out until the memory cell array has a desired number of stacked layers. It should be noted that the extending direction of the line-and-space pattern to be formed in the electrode layer is to be alternate such as X direction, Y direction, X direction, etc.

Then, as shown in FIGS. 13A to 13E, an electrode layer EL3 to become the wiring of the uppermost layer is formed. The electrode layer EL3 is formed to make contact with the cap film C2 successively to FIGS. 12A to 12E. A hard mask layer HM3 having a thickness such that etching can be carried out from the electrode layer EL3 to the rectifying layer D2 of the second layer is formed on the electrode layer EL3. Thereafter, a resist RS5 is applied on the hard mask layer HM3, and a pattern in which the line-and-space pattern immediately below is rotated 90 degrees in the in-plane direction, that is, the line-and-space pattern extending in the X direction is formed in the memory cell section 100 and the word line drawing section 120W by the lithography technique. The resist RS5 is not formed in the bit line drawing section 120B so that the hard mask layer HM3 and the electrode layer EL3 do not remain.

Thereafter, the hard mask layer HM3 is processed by the anisotropic etching such as the RIE method using the resist RS5 as the mask to transfer the pattern to the hard mask layer HM3. Furthermore, after the resist RS5 is removed by the oxygen discharge, the etching is carried out from the electrode layer EL3 to the rectifying layer D2 until the bottom portion of the rectifying layer D2 is separated from the rectifying layer D2 of the memory cell MC adjacent in the Y direction in the memory cell section 100 by the anisotropic etching such as the RIE method using the hard mask layer HM3 as the mask, as shown in FIG. 14A to FIG. 14E. In this case, the memory cell configuring member is first etched under the condition that there is a selection ratio with respect to the inter-layer insulating film IN2 (oxide film), and then the inter-layer insulating film IN2 is etched under the condition that there is barely any selection ratio of the memory cell configuring member (rectifying layer D2) and the inter-layer insulating film IN2.

Thus, in the memory cell section 100, an electrode layer EL3 of a third layer becomes a word line WL2, and a memory cell array of the second layer in which the memory cell MC including stacked films of the cap film C2, the rectifying layer D2, and the variable resistive layer VR2 defined by the width of the bit line BL1 and the width of the word line WL2 is arranged at each intersecting position of the bit line BL1 and the word line WL2 is formed. In the etching of the inter-layer insulating film IN2, the etching is sufficiently carried out so that there are no remains (residuals) of the memory cell configuring member between the adjacent memory cells MC in the memory cell section 100.

In the word line drawing section 120W, the inter-layer insulating film IN2 and the electrode layer EL3 of the third layer are stacked on the dummy pattern DP, where the etching is not carried out up to the dummy pattern DP below the inter-layer insulating film IN2 since the inter-layer insulating film IN2 functions as a stopper when etching the memory cell configuring member in the first condition. The inter-layer insulating film IN2 is etched in the etching of the inter-layer insulating film IN2 under the next condition that there is barely any selection ratio between the memory cell configuring member and the inter-layer insulating film IN2. In this case, the variable resistive layer VR2 at the upper part of the dummy pattern DP is etched in some measure under the condition of the etching in which the rectifying layer D2 immediately above the bit line BL where the residual easily produces between the adjacent memory cells MC can be sufficiently removed, but the etching can be stopped at the upper part of the dummy pattern DP. The bit line drawing section 120B is in a state the stacked films from the electrode layer EL3 to the rectifying layer D2 are removed.

After the hard mask layer HM3 is removed, as shown in FIGS. 15A to 15E, the inter-layer insulating film IN3 such as the TEOS film is embedded in the etched region, and the upper surface is planarized while removing the inter-layer insulating film IN3 formed above the word line WL2 with the word line WL2 as the stopper by the CMP method. Furthermore, contacts are provided in the inter-layer insulating film, and the non-volatile memory device is thereby manufactured.

In FIG. 3A to FIG. 15E, a case of using the memory cell configuring member remained over the entire region of the drawing sections 120W, 120B as the dummy pattern DP has been described, but the memory cell configuring member may be patterned to a line-and-space shape as in the memory cell section 100 in the drawing sections 120W, 120B as well, and that in which the inter-layer insulating film is embedded between the patterns may be used for the dummy pattern DP.

As described above, in the present embodiment, the dummy pattern DP is arranged in the layer corresponding to the memory layer immediately below the wiring (word line WL or bit line BL) in the drawing sections 120W, 120B connecting between the memory cell section 100 and the contact section 110. Thus, when forming the memory cell MC at the cross point of the wirings by alternately rotating the line-and-space pattern by 90 degrees, the etching amount at the dummy pattern DP can be suppressed in the drawing sections 120W, 120B while ensuring a sufficient etching amount so that the memory cell configuring member does not remain between the adjacent memory cells MC in the memory cell section 100. As a result, etching is not excessively carried out as in the memory cell section 100 in the drawing sections 120W, 120B, whereby the generation of stress generated between the memory cell configuring member and the inter-layer insulating film in the processed line-and-space pattern can be suppressed, and the destruction of the pattern can be suppressed.

Furthermore, the dummy patter DP does not operate as the actual memory cell MC since the upper part of the dummy pattern DP is removed so as to be electrically insulated from the wiring (word line WL or bit line BL) arranged at the upper part using a pattern having a stacked structure similar to the memory cell MC for the dummy pattern DP. Furthermore, a material different from the memory cell MC does not need to be prepared for the dummy pattern DP, so that the manufacturing step of the non-volatile memory device does not extremely increase by the formation of the dummy pattern DP compared to when not using the dummy pattern DP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory device comprising:
   a memory cell section including a first wiring extending in a first direction, a second wiring extending in a second direction intersecting the first wiring, and a memory layer in which a non-volatile memory cell is arranged so as to be sandwiched by the first and second wirings at an intersecting position of the first and second wirings, the memory layer being stacked in plurals while sharing the first or second wiring with the memory layer adjacent to a thickness direction;
   a first contact section arranged in the extending direction of the first wiring of the memory cell section;
   a second contact section arranged in the extending direction of the second wiring of the memory cell section;
   a first drawing section configured to connect the memory cell section and the first contact section with the first wiring; and
   a second drawing section configured to connect the memory cell section and the second contact section with the second wiring, wherein
   a dummy pattern is provided in a layer corresponding to the memory layer immediately below the first and second wirings configuring the first and second drawing sections.

2. The non-volatile memory device according to claim 1, wherein
   the dummy pattern is configured by a configuring member same as the memory layer, and
   an upper part of the dummy pattern has the upper part retrieved compared to the memory layer.

3. The non-volatile memory device according to claim 1, wherein an inter-layer insulating film made of a material different from the dummy pattern is formed between the non-volatile memory cells of the memory cell section, and other than the first and second wirings and the dummy pattern forming position in a region other than the memory cell section.

4. The non-volatile memory device according to claim 1, wherein
   the first wiring is formed to a line-and-space shape at a predetermined interval in the second direction, and
   the second wiring is formed to a line-and-space shape at a predetermined interval in the first direction.

5. The non-volatile memory device according to claim 4, wherein the dummy pattern is,
   a line-and-space pattern extending in the second direction at immediately below the first wiring configuring the first drawing section, and
   a line-and-space pattern extending in the first direction at immediately below the second wiring configuring the second drawing section.

6. The non-volatile memory device according to claim 2, wherein the memory layer has a stacked structure including a stacked film of a rectifying layer and a variable resistive layer, which is capable of switching a high resistance state and a low resistance state, and a cap film made of a conductive material.

7. The non-volatile memory device according to claim 6, wherein the dummy pattern has the memory layer in which the cap film is removed.

8. The non-volatile memory device according to claim 6, wherein the variable resistive layer is a metal oxide film containing at least one or more elements selected from a group consisting of Si, Ti, Ta, Nb, Hf, Zr, W, Al, Ni, Co, Mn, Fe, Cu, Mo, a carbon film, or a chalcogenide compound.

9. A manufacturing method of a non-volatile memory device having a non-volatile memory cell, which is arranged at an intersecting position of a plurality of first wirings extending in a first direction and a plurality of second wirings extending in a second direction intersecting the first direction so as to be sandwiched between the first and second wirings, stacked in plurals in a thickness direction, the manufacturing method comprising:

stacking a first electrode layer to become the first wiring, and a first memory layer configuring layer configuring the non-volatile memory cell above a substrate;

patterning the first memory layer configuring layer and the first electrode layer to a line-and-space shape extending in the first direction in a memory cell forming region and a first wiring drawing region extending in the first direction from the memory cell forming region, and patterning to leave the first memory layer configuring layer and the first electrode layer in a second wiring drawing region extending in the second direction from the memory cell forming region;

forming a first mask layer to cover the memory cell forming region, and retrieving the first memory layer configuring layer remained in the second wiring drawing region by a predetermined amount from an upper surface;

forming a first inter-layer insulating film in the memory cell forming region, the first wiring drawing region, and the second wiring drawing region so as to be embedded between structures patterned to the line-and-space shape in the memory cell forming region after retrieving the first memory layer configuring layer;

stacking a second electrode layer to become the second wiring and a second memory layer configuring layer configuring the non-volatile memory cell on the structures and the first inter-layer insulating film;

forming a second mask layer having a line-and-space pattern extending in the second direction in the memory cell forming region and the second wiring drawing region and having a predetermined pattern to cover the first wiring drawing region in the first wiring drawing region on the second memory layer configuring layer; and patterning to a line-and-space shape extending in the second direction by etching the second memory layer configuring layer, the second electrode layer, the first memory layer configuring layer, and the first inter-layer insulating film in the memory cell forming region, and patterning to the line-and-space shape extending in the second direction by etching the second memory layer configuring layer, the second electrode layer, and the first inter-layer insulating film in the second wiring drawing region with the second mask layer as a mask.

10. The manufacturing method of the non-volatile memory device according to claim 9, wherein in the patterning with the second mask layer as the mask, the first memory layer configuring layer is etched under a condition that the first memory layer configuring layer is more easily etched than the first inter-layer insulating film, and then the first inter-layer insulating film is etched under a condition that the first inter-layer insulating film and the remaining first memory layer configuring layer have substantially the same etching rate.

11. The manufacturing method of the non-volatile memory device according to claim 10, wherein the first inter-layer insulating film is etched under a condition that etching is stopped at an upper part of the first memory layer configuring layer retrieved by a predetermined amount in the second wiring drawing region.

12. The manufacturing method of the non-volatile memory device according to claim 9, further comprising:

forming a third mask layer to cover the memory cell forming region after patterning with the second mask layer as the mask, and retrieving the second memory layer configuring layer patterned to the predetermined pattern and left in the first wiring drawing region when patterned with the second mask layer as the mask by a predetermined amount from an upper surface;

forming a second inter-layer insulating film in the memory cell forming region, the first wiring drawing region, and the second wiring drawing region so as to be embedded between structures patterned to the line-and-space shape in the memory cell forming region after retrieving the second memory layer configuring layer;

stacking a third electrode layer to become the first wiring and a third memory layer configuring layer configuring the non-volatile memory cell on the structures and the second inter-layer insulating film;

forming a fourth mask layer having a line-and-space pattern extending in the first direction in the memory cell forming region and the first wiring drawing region on the third memory layer configuring layer; and patterning to a line-and-space shape extending in the first direction by etching the third memory layer configuring layer, the third electrode layer, the second memory layer configuring layer, and the second inter-layer insulating film in the memory cell forming region, and patterning to the line-and-space shape extending in the first direction by etching the third memory layer configuring layer, the third electrode layer, and the second inter-layer insulating film in the first wiring drawing region with the fourth mask layer as a mask.

13. The manufacturing method of the non-volatile memory device according to claim 12, wherein in the patterning with the fourth mask layer as the mask, the second memory layer configuring layer is etched under a condition that the second memory layer configuring layer is more easily etched than the second inter-layer insulating film, and then the second inter-layer insulating film is etched under a condition that the second inter-layer insulating film and the remaining second memory layer configuring layer have substantially the same etching rate.

14. The manufacturing method of the non-volatile memory device according to claim 13, wherein the second inter-layer insulating film is etched under a condition that etching is stopped at an upper part of the second memory layer configuring layer retrieved by a predetermined amount in the first wiring drawing region.

15. The manufacturing method of the non-volatile memory device according to claim 12, wherein in the retrieving the first memory layer configuring layer, the first memory layer configuring layer patterned to the line-and-space shape in the first wiring drawing region is also retrieved by a predetermined amount from an upper surface, similar to the first memory layer configuring layer remained in the second wiring drawing region.

16. The manufacturing method of the non-volatile memory device according to claim 9, wherein the first memory layer configuring layer has a stacked structure including a stacked film of a rectifying layer and a variable resistive layer, which is capable of switching a high resistance state and a low resistance state, and a cap film made of a conductive material.

17. The manufacturing method of the non-volatile memory device according to claim 16, wherein the cap film configuring the first memory layer configuring layer is removed when retrieving the first memory layer configuring layer.

18. The manufacturing method of the non-volatile memory device according to claim 16, wherein the variable resistive layer is a metal oxide film containing at least one or more elements selected from a group consisting of Si, Ti, Ta, Nb, Hf, Zr, W, Al, Ni, Co, Mn, Fe, Cu, Mo, a carbon film, or a chalcogenide compound.

19. The manufacturing method of the non-volatile memory device according to claim 12, wherein the second memory layer configuring layer has a stacked structure including a stacked film of a rectifying layer and a variable resistive layer, which is capable of switching a high resistance state and a low resistance state, and a cap film made of a conductive material.

20. The manufacturing method of the non-volatile memory device according to claim 19, wherein the cap film configuring the second memory layer configuring layer is removed when retrieving the second memory layer configuring layer.

* * * * *